United States Patent
Pickett et al.

(10) Patent No.: US 9,251,922 B2
(45) Date of Patent: Feb. 2, 2016

(54) PREPARATION OF NANOPARTICLE MATERIAL

(71) Applicant: Nanoco Technologies, Ltd., Manchester (GB)

(72) Inventors: Nigel Pickett, Manchester (GB); James Harris, Manchester (GB)

(73) Assignee: Nanoco Technologies, Ltd., Mancheser (GB)

( * ) Notice: Subject to any disclaimer, the term of this patent is extended or adjusted under 35 U.S.C. 154(b) by 0 days.

(21) Appl. No.: 14/331,018

(22) Filed: Jul. 14, 2014

(65) Prior Publication Data

US 2014/0319433 A1 Oct. 30, 2014

Related U.S. Application Data

(62) Division of application No. 12/324,354, filed on Nov. 26, 2008, now Pat. No. 8,784,701.

(60) Provisional application No. 60/991,510, filed on Nov. 30, 2007.

(51) Int. Cl.
| | |
|---|---|
| H01B 1/02 | (2006.01) |
| C09D 11/00 | (2014.01) |
| B82Y 30/00 | (2011.01) |
| C09D 11/037 | (2014.01) |
| H01L 31/032 | (2006.01) |
| H01L 31/072 | (2012.01) |
| H01L 31/18 | (2006.01) |
| C09D 11/52 | (2014.01) |
| H01L 31/0352 | (2006.01) |

(52) U.S. Cl.
CPC . *H01B 1/02* (2013.01); *B82Y 30/00* (2013.01); *C09D 11/037* (2013.01); *C09D 11/52* (2013.01); *H01L 31/0322* (2013.01); *H01L 31/072* (2013.01); *H01L 31/18* (2013.01); *H01L 31/0352* (2013.01); *Y02E 10/541* (2013.01)

(58) Field of Classification Search
None
See application file for complete search history.

(56) References Cited

U.S. PATENT DOCUMENTS

| | | | |
|---|---|---|---|
| 2,769,838 | A | 11/1956 | Matter et al. |
| 3,524,771 | A | 8/1970 | Green |
| 4,609,689 | A | 9/1986 | Schwartz et al. |
| 6,114,038 | A | 9/2000 | Castro et al. |
| 6,207,229 | B1 | 3/2001 | Bawendi et al. |
| 6,221,602 | B1 | 4/2001 | Barbera-Guillem et al. |
| 6,261,779 | B1 | 7/2001 | Barbera-Guillem et al. |
| 6,322,901 | B1 | 11/2001 | Bawendi et al. |
| 6,326,144 | B1 | 12/2001 | Bawendi et al. |
| 6,333,110 | B1 | 12/2001 | Barbera-Guillem et al. |
| 6,379,635 | B2 | 4/2002 | O'Brien et al. |
| 6,423,551 | B1 | 7/2002 | Weiss et al. |
| 6,426,513 | B1 | 7/2002 | Bawendi et al. |
| 6,607,829 | B1 | 8/2003 | Bawendi et al. |
| 6,660,379 | B1 | 12/2003 | Lakowicz et al. |
| 6,699,723 | B1 | 3/2004 | Weiss et al. |
| 6,815,064 | B2 | 11/2004 | Treadway et al. |
| 6,855,551 | B2 | 2/2005 | Bawendi et al. |
| 6,914,264 | B2 | 7/2005 | Chen et al. |
| 6,992,202 | B1 | 1/2006 | Banger et al. |
| 7,151,047 | B2 | 12/2006 | Chan et al. |
| 7,235,361 | B2 | 6/2007 | Bawendi et al. |
| 7,264,527 | B2 | 9/2007 | Bawendi et al. |
| 7,544,725 | B2 | 6/2009 | Pickett et al. |
| 7,588,828 | B2 | 9/2009 | Mushtaq et al. |
| 7,674,844 | B2 | 3/2010 | Pickett et al. |
| 7,803,423 | B2 | 9/2010 | O'Brien et al. |
| 7,867,556 | B2 | 1/2011 | Pickett |
| 7,867,557 | B2 | 1/2011 | Pickett et al. |
| 8,337,720 | B2 | 12/2012 | McCairn et al. |
| 8,563,348 | B2 | 10/2013 | Harris et al. |
| 8,784,701 | B2 | 7/2014 | Pickett et al. |
| 2003/0017264 | A1 | 1/2003 | Treadway et al. |
| 2003/0106488 | A1 | 6/2003 | Huang et al. |
| 2003/0148024 | A1 | 8/2003 | Kodas et al. |
| 2004/0007169 | A1 | 1/2004 | Ohtsu et al. |
| 2004/0036130 | A1 | 2/2004 | Lee et al. |
| 2004/0110002 | A1 | 6/2004 | Kim et al. |
| 2004/0110347 | A1 | 6/2004 | Yamashita |
| 2004/0178390 | A1 | 9/2004 | Whiteford et al. |
| 2004/0250745 | A1 | 12/2004 | Ogura et al. |

(Continued)

FOREIGN PATENT DOCUMENTS

| | | |
|---|---|---|
| CN | 1394599 | 2/2003 |
| CN | 1997778 A | 7/2007 |

(Continued)

OTHER PUBLICATIONS

Wang et al. Size-controlled synthesis of magnetic CuCr2Se4 nanocrystals. American Chemical Society. 2007, 129, 12408-12409.*

(Continued)

*Primary Examiner* — Tanisha Diggs
(74) *Attorney, Agent, or Firm* — Blank Rome LLP

(57) ABSTRACT

A process for producing nanoparticles incorporating ions selected from groups 13, 16, and 11 or 12 of the periodic table is described. The process comprises effecting conversion of a nanoparticle precursor composition comprising said group 13, 16, and 11 or 12 ions to the material of the nanoparticles in the presence of a selenol compound. A process for fabricating a thin film comprising nanoparticles incorporating ions selected from groups 13, 16, and 11 or 12 of the periodic table is also described, as well as a process for producing a printable ink formulation comprising said nanoparticles.

8 Claims, 9 Drawing Sheets

(56) References Cited

U.S. PATENT DOCUMENTS

| | | | |
|---|---|---|---|
| 2005/0098204 | A1 | 5/2005 | Roscheisen et al. |
| 2005/0129947 | A1 | 6/2005 | Peng et al. |
| 2005/0145853 | A1 | 7/2005 | Sato et al. |
| 2005/0183767 | A1 | 8/2005 | Yu et al. |
| 2006/0019098 | A1 | 1/2006 | Chan et al. |
| 2006/0057382 | A1 | 3/2006 | Treadway et al. |
| 2006/0061017 | A1 | 3/2006 | Strouse et al. |
| 2006/0068154 | A1 | 3/2006 | Parce et al. |
| 2006/0110279 | A1 | 5/2006 | Han et al. |
| 2006/0118757 | A1 | 6/2006 | Klimov et al. |
| 2006/0130741 | A1 | 6/2006 | Peng et al. |
| 2007/0012941 | A1 | 1/2007 | Cheon |
| 2007/0034833 | A1 | 2/2007 | Parce et al. |
| 2007/0059705 | A1 | 3/2007 | Lu et al. |
| 2007/0104865 | A1 | 5/2007 | Pickett |
| 2007/0110816 | A1 | 5/2007 | Jun et al. |
| 2007/0114520 | A1 | 5/2007 | Garditz et al. |
| 2007/0125983 | A1 | 6/2007 | Treadway et al. |
| 2007/0131905 | A1 | 6/2007 | Sato et al. |
| 2007/0199109 | A1 | 8/2007 | Yi et al. |
| 2007/0238126 | A1 | 10/2007 | Pickett et al. |
| 2008/0107911 | A1 | 5/2008 | Liu et al. |
| 2008/0112877 | A1 | 5/2008 | Xiao et al. |
| 2008/0121844 | A1 | 5/2008 | Jang et al. |
| 2008/0220593 | A1 | 9/2008 | Pickett et al. |
| 2008/0264479 | A1 | 10/2008 | Harris et al. |
| 2009/0139574 | A1 | 6/2009 | Pickett et al. |
| 2010/0059721 | A1 | 3/2010 | Pickett et al. |
| 2010/0068522 | A1 | 3/2010 | Pickett et al. |
| 2010/0113813 | A1 | 5/2010 | Pickett et al. |
| 2010/0123155 | A1 | 5/2010 | Pickett et al. |
| 2010/0193767 | A1 | 8/2010 | Naasani et al. |
| 2010/0212544 | A1 | 8/2010 | Harris et al. |

FOREIGN PATENT DOCUMENTS

| | | |
|---|---|---|
| CN | ZL200880118106.4 | 3/2014 |
| EP | 1176646 | 1/2002 |
| EP | 1783137 | 5/2007 |
| EP | 1854792 | 11/2007 |
| GB | 2429838 | 3/2007 |
| JP | 2005139389 | 6/2005 |
| JP | 2008192542 | 8/2008 |
| JP | 5566901 | 6/2014 |
| TW | I460281 | 11/2014 |
| WO | 9710175 | 3/1997 |
| WO | 0017642 | 3/2000 |
| WO | 0204527 | 1/2002 |
| WO | 0224623 | 3/2002 |
| WO | 0229140 | 4/2002 |
| WO | 03099708 | 12/2003 |
| WO | 2004008550 | 1/2004 |
| WO | 2004033366 | 4/2004 |
| WO | 2004065362 | 8/2004 |
| WO | 2004066361 | 8/2004 |
| WO | 2005021150 | 3/2005 |
| WO | 2005106082 | 11/2005 |
| WO | 2005123575 | 12/2005 |
| WO | 2006001848 | 1/2006 |
| WO | 2006017125 | 2/2006 |
| WO | 2006034280 A2 | 3/2006 |
| WO | 2006/073437 | 7/2006 |
| WO | 2006075974 | 7/2006 |
| WO | 2006101986 | 9/2006 |
| WO | 2006101986 | 9/2006 |
| WO | 2006116337 | 11/2006 |
| WO | 2006118543 | 11/2006 |
| WO | 2006134599 | 12/2006 |
| WO | 2007020416 | 2/2007 |
| WO | 2007049052 | 5/2007 |
| WO | 2007060591 | 5/2007 |
| WO | 2007065039 | 6/2007 |
| WO | 2007098378 | 8/2007 |
| WO | 2007102799 | 9/2007 |
| WO | 2008013780 | 1/2008 |
| WO | 2008054874 | 5/2008 |
| WO | 2008063190 | 5/2008 |
| WO | 2008133660 | 11/2008 |
| WO | 2009016354 | 2/2009 |
| WO | 2009040553 | 4/2009 |
| WO | 2009106810 | 9/2009 |

OTHER PUBLICATIONS

International Search Report for PCT/GB2009/001928 mailed Dec. 8, 2009 (3 pages).
International Search Report for PCT/GB2009/002605 mailed Feb. 22, 2010 (3 pages).
Search Report for GB0813273.0 searched Dec. 8, 2008 (1 page).
Search Report for GB0814458.6 searched Dec. 5, 2008 (2 pages).
Search Report for GB0820101.4 searched Mar. 3, 2009 (1 page).
Search Report for GB0821122.9 searched Mar. 19, 2009 (2 pages).
Foneberov et al., "Photoluminescence of tetrahedral quantum-dot quantum wells" Physica E, 26:63-66 (2005).
Cao, "Effect of Layer Thickness on the Luminescence Properties of ZnS/CdS/ZnS quantum dot quantum well", J. of Colloid and Interface Science 284:516-520 (2005).
Harrison et al. "Wet Chemical Synthesis on Spectroscopic Study of CdHgTe Nanocrystals with Strong Near-Infrared Luminescence" Mat. Sci and Eng.B69-70:355-360 (2000).
Sheng et al."In-Situ Encapsulation of Quantum Dots into Polymer Microsphers", Langmuir 22(8):3782-3790(2006).
W. Peter Wuelfing et al., "Supporting Information for Nanometer Gold Clusters Protected by Surface Bound Monolayers of Thiolated Poly (ethylene glycol) Polymer Electrolyte" Journal of the American Chemical Society (XP002529160), 1998.
International Search Report for PCT/GB2009/00051 0 mailed Jul. 6, 2010 (16 pages).
International Search Report for PCT/GB2008/003958 mailed Sep. 4, 2009 (3 pages).
Banger et al., "Ternary single-source precursors for polycrystalline thin-film solar cells" Applied Organometallic Chemistry, 16:617-627, XP002525473 Scheme 1 Chemical Synthesis (2002).
D Qi, M Fischbein, M Drndic, S. Selmic, "Efficient polymer-nanocrystal quantum-dot photodetectors", Appl. Phys. Lett., 2004, 84, 4295.
Shen et al., "Photoacoustic and photoelectrochemical characterization of CdSe-sensitized Ti02 electrodes composed of nanotubes and nanowires" Thin Solid Films, Elsevier-Sequoia S.A. Lausanne, CH vol. 499, No. 1-2, Mar. 21, 2006, pp. 299-305, XP005272241 ISSN: 0040-6090.
Smestad GP, et al., "A technique to compare polythiophene solid-state dye sensitized Ti02 solar cells to liquid junction devices" Solar Energy Materials and Solar Cells, Elsevier Science Publishers, Amsterdam, NL, vol. 76, No. 1, Feb. 15, 2003, pp. 85-105, XP004400821 ISSN: 0927-0248.
Chen et al., "Electrochemically synthesized CdS nanoparticle-modified Ti02 nanotube-array photoelectrodes: Preparation, characterization, and application to photoelectrochemical cells" Journal of Photochemistry and Photobiology, a: Chemistry, Elsevier Sequoia Lausanne, CH, vol. 177, No. 2-3, Jan. 25, 2006, pp. 177-184, XP005239590 ISSN: 1010-6030
Wang, et al., "In situ polymerization of amphiphilic diacetylene for hole transport in solid state dye-sensitized solar cells" Organic Electronics, ElSevier, Amsterdam NL, vol. 7, No. 6, Nov. 18, 2006, pp. 546-550, XP005773063 ISSN: 1566-1199.
International Search Report and Written Opinion for PCT/GB2008/001457 mailed Aug. 21, 2008 (14 pages).
Richardson et al., "Chemical Engineering: Chemical and Biochemical Reactors and Process Control," vol. 3, Third Edition, pp. 3-5 (1994).
Borchert et al., "High Resolution Photoemission STudy of CdSe and CdSe/ZnS Core-Shell Nanocrystals," Journal of Chemical Physics, vol. 119, No. 3, pp. 1800-1807 (2003).
Gaponik et al., "Thioi-Capping of CdTe Nanocrystals: An Alternative to Organometallic Synthetic Routes," Journal of Physical Chemistry B, vol. 106, No. 29, pp. 7177-7185 (2002).

(56) References Cited

OTHER PUBLICATIONS

Pickett et al., "Syntheses of Semiconductor Nanoparticles Using Single-Molecular Precursors," The Chemical Record, vol. 1 pp. 467-479 (2001).
International Search Report and Written Opinion for International Application No. PCT/G82008/001349 mailed Nov. 18, 2008 (16 pages).
Patent Act 1977 Search Report under Section 17 for Application No. GB0522027.2 dated Jan. 27, 2006.
Patent Act 1977 Search Report under Section 17 for Application No. GB0723539.3 dated Mar. 27, 2008.
Patents Act 1977: Search Report under Section 17 for Application No. GB 0606845.6 dated Sep. 14, 2006.
Patents Act 1977: Search Report under Section 17 for Application No. GB 0719075.4, dated Jan. 22, 2008.
Patents Act 1997: Search Report under Section 17 for Application No. GB0409877.8 dated Oct. 7, 2004.
Patents Act 1977: Search Report under Section17 for Application No. GB 0719073.9, dated Feb. 29, 2008.
Barron, "Group III Materials: New Phases and Nona-particles with Applications in Electronics and Optoelectronics," Office of Naval Research Final Report (1999).
Dabousi et al., "(CdSe)ZnS Core-Shell Quantum Dots: Synthesis and Characterization of a Size Series of Highly Luminescent Nanocrystallites," Jrl. Phys. Chem.,(1997) 101, pp. 9463-9475.
Dehnen et al., "Chalcogen-Bridged Copper Clusters," Eur. J. Inorg. Chem., (2002) pp. 279-317.
Eisenmann et al., "New Phosphide-bridged Multinuclear Complexes of Ag and Zn," Zeitschrift fur anorganische and allgemeine Chemi (1995). (1 page—abstract).
Muller et al., "From Giant Molecular Clusters and Precursors to Solid-state Structures," Current Opinion in Solid State and Materials Science, 4 (Apr. 1999) pp. 141-153.
Shulz et al., J. Elect. Mat. (1998) 27:433-437.
Timoshkin, "Group 13 imido metal lanes and their heavier analogs [RMYR']n (M=Al, Ga, In; Y=N, P, As, Sb)," Coordination Chemistry Reviews (2005).
Vittal, "The chemistry of inorganic and organometallic compounds with adameantane-like structures," Polyhedron, vol. 15, No. 10, pp. 1585-1642 (1996).
Zhong et al, "Composition-Tunable ZnxCu1-xSe Nanocrytals with High Luminescence and Stability", Jrl Amer. Chern. Soc. (2003).
International Search Report for PCT/GB2006/003028 mailed Jan. 22, 2007 (5 pages).
Nielsch et al., "Uniform Nickel Deposition into Ordered Alumina Pores by Pulsed Electrodeposition", Advanced Materials, 2000 vol. 12, No. 8, pp. 582-586.
Huang et al., "Bio-Inspired Fabrication of Antireflection Nanostructures by Replicating Fly Eyes", Nanotechnology (2008) vol. 19.
Materials Research Society Symposium Proceedings Quantum Dots, Nanoparticles and Nanowires, 2004, ISSN: 0272-9172.
Xie et. al., "Synthesis and Characterization of Highly Luminescent CdSe-Core CdS/Zn0.5Cd0.5S/ZnS Multishell Nanocrystals," JACS Articles published on web Apr. 29, 2005.
Kim et. al., "Engineering InAsxP1-x/InP/ZnSe II I-V Alloyed Core-Shell Quantum Dots for the Near-Infrared," JACS Articles published on web Jul. 8, 2005.
Rao et. al. "The Chemistry of Nanomaterials: Synthesis, Properties and Applications" (2004).
Trinidade et al., "Nanocrystalline Seminconductors: Synthesis, Properties, and Perspectives", Chemistry of Materials, (2001) vol. 13, No. 11, pp. 3843-3858.
Agger, J.R. et al., J. Phys. Chem. B (1998) 102, pp. 3345-3353.
Aldana, J. et al. "Photochemical Instability of CdSe Nanocrystals Coated by Hydrophilic Thiols", J. Am. Chem. Soc. (2001),123: 8844-8850. Alivisatos, A.P. Perspectives on the Physical Chemistry.
Alivisatos, A.P. "Perspectives on the Physical Chemistry of Semiconductor Nanocrystals", ,J. Phys. Chem., (1996), 100, pp. 13226-13239.

Arici et al., Thin Solid Films 451-452 (2004) 612-618.
Battaglia et al., "Colloidal Two-dimensional Systems: CdSe Quantum Shells and Wells," Angew Chem . . . (2003) 42:5035-5039.
Bawendi, M.G. "The Quantum Mechanics of Larger Semiconductor Clusters ("Quantum Dots")", Annu. Rev. Phys. Chem. (1990), 42: 477-498.
Berry, C.R. "Structure and Optical Absorption of Agi Microcrystals", Phys. Rev. (1967) 161: 848-851.
Bunge, S.D. et al. "Growth and morphology of cadmium chalcogenides: the synthesis of nanorods, tetrapods, and spheres from CdO and Cd(02CCH3)2", J. Mater. Chem. (2003) 13:1705-1709.
Castro et al., "Synthesis and Characterization of Colloidal CuInS2 Nanoparticles from a Molecular Single-Source Precursors," J. Phys. Chem. B (2004) 108:12429.
Castro et al., Chem. Mater. (2003) 15:3142-3147.
Chun et al., Thin Solid Films 480-481 (2005) 46-49.
Contreras et al., "ZnO/ZnS(O,OH)/Cu(In,Ga)Se2/Mo Solar Cell with 18:6% Efficiency," from 3d World Conf. on Photovol. Energy Conv., Late News Paper (2003) pp. 570-573.
Cui et al., "Harvest of near infrared light in PbSe nanocrystal-polymer hybrid photovoltaic cells," Appl. Physics Lett. 88 (2006) 183111-183111-3.
Cumberland et al., "Inorganic Clusters as Single-Source Precursors for Preparation of CdSe, ZnSe, and CdSe/ZnS Nanomaterials" ChemistrY of Materials, 14, pp. 1576-1584 (2002).
Dance et al., J. Am. Chem. Soc. (1984) 106:6285-6295.
Daniels et al., "New Zinc and Cadmium Chalcogenide Structured Nanoparticles," Mat. Res. Soc. Symp. Proc. 789 (2004) pp. 31-36.
Eychmuller, A. et al. "A quantum dot quantum well: CdS/HgS/CdS", Chem. Phys. Lett. 208, pp. 59-62 (1993).
Fendler, J.H. et al. "The Colloid Chemical Approach to Nanostructured Materials", Adv. Mater. (1995) 7: 607-632.
Gao, M. et al. "Synthesis of PbS Nanoparticles in Polymer Matrices", J. Chem. Soc. Commun. (1994) pp. 2779-2780.
Gou et al., J. Am. Chem. Soc. (2006) 128:7222-7229.
Gur et al., "Air stable all-inorganic nanocrystal solar cells processed from solution," Lawrence Berkeley Natl. Lab., Univ. of California, paper LBNL-58424 (2005).
Gurin, Colloids Surf. A (1998) 142:35-40.
Guzelian, A. et al. "Colloidal chemical synthesis and characterization of InAs nanocrystal quantum dots", Appl. Phys. Lett. (1996) 69: 1432-1434.
Guzelian, A. et al., "Synthesis of Size-Selected, Surface-Passivated InP Nanocrystals",,L Phys. Chem. (1996) 100: 7212-7219.
Hagfeldt, A. et al. "Light-induced Redox Reactions in Nanocrystalline Systems", Chem. Rev. (1995) 95: 49-68.
Henglein, A. "Small-Particle Research: Physicochemical Properties of Extremely Small Colloidal Metal and Semiconductor Particles", Chem Rev. (1989) 89: 1861-1873.
Hirpo et al., "Synthesis of Mixed Copper—Indium Chalcogenolates. Single-Source Precursors for the Photovoltaic Materials CuInQ2 (Q=S, Se)," J. Am. Chem. Soc.—(1993) 115:1597.
Hu et al., "Hydrothermal preparation of CuGaS2 crystallites with different morphologies", Sol. State Comm . . . (2002) 121 :493-496.
International Search Report for PCT/GB2005/001611 mailed Sep. 8, 2005 (5 pages).
Jegier, JA et al. "Poly(imidogallane): Synthesis of a Crystalline 2-D Network Solid and Its Pyrolysis to Form Nanocrystalline Gallium Nitride in Supercritical Ammonia", Chem. Mater. (1998) 10: 2041-2043.
Jiang et al., Inora. Chem. (2000) 39:2964-2965.
Kaelin et al., "CIS and CIGS layers from selenized nanoparticle precursors," Thin Solid Films 431-432 (2003) pp. 58-62.
Kapur et al., "Non-Vacuum processing of CuIn'_xGaxSe2 solar cells on rigid and flexible substrates using nanoparticle precursor inks," Thin Solid Films 431-432—(2003) pp. 53-57.
Kher, S. et al. "A Straightforward, New Method for the Synthesis of Nanocrystalline GaAs and GaP", Chem. Mater. (1994) 6: 2056-2062.
Kim et al., "Synthesis of CuinGaSe2 Nanoparticles by Low Temperature Colloidal Route",,L Mech. Sci. Tech .. (2005) 19: 2085-2090.
Law et al., "Nanowire dye-sensitized solar cells," Nature Mater. (2005) vol. 4 pp. 455-459.

(56) References Cited

OTHER PUBLICATIONS

Li et al., Adv. Mat(1999) 11:1456-1459.

Lieber, C. al. "Understanding and Manipulating Inorganic Materials with Scanning Probe Microscopes", Angew. Chem. Int. Ed. Engl. (1996) 35: 687-704.

Little et al., "Formation of Quantum-dot quantum-well heteronanostructures with large lattice mismatch: Zn/CdS/ZnS," 114 J. Chem. Phys. 4 (2001).

Lu et al., Inorg. Chem. (2000) 39:1606-1607.

Lover, T. et al. "Preparation of a novel CdS nanocluster material from a thiophenolate-capped CdS cluster by chemical removal of SPh ligands", J. Mater. Chem. (1997) 7(4): 647-651.

Malik et al., Adv. Mat., (1999) 11:1441-1444.

Matijevic, E. "Monodispersed Colloids: Art and Science", Langmuir (1986) 2:12-20.

Matijevic, E. "Production of Monodispersed Colloidal Particles", Ann. Rev. Mater. Sci. (1985) 15: 483-518.

Mekis, I. et al., "One-Pot Synthesis of Highly Luminescent CdSe/CdS Core-Shell Nanocrystals via Organometallic and "Greener" Chemical Approaches", J. Phys. Chem. B. (2003) 107: 7454-7462.

Mews et al., J. Phys. Chem. (1994) 98:934-941.

Micic et al., "Synthesis and Characterization of InP, GaP, and GaInP2 Quantum Dots", J. Phys. Chem. (1995) pp. 7754-7759.

Milliron et al., "Electroactive Surfactant Designed to Mediate Electron Transfer between CdSe Nanocrystals and Organic Semiconductors," Adv. Materials (2003) 15, No. 1, pp. 58-61.

Murray, C.B. et al., "Synthesis and Characterization of Nearly Monodisperse CdE (E=S, Se, Te) Semiconductor Nanocrystallites", J. Am. Chem. Soc. (1993) 115 (19) pp. 8706-8715.

Nairn et al., Nano Letters (2006) 6:1218-1223.

\* cited by examiner

PREPARATION OF NANOPARTICLE MATERIAL

This application is a divisional of U.S. patent application Ser. No. 12/324,354 filed Nov. 26, 2008, which claims priority to and the benefit of U.S. Provisional Application No. 60/991,510, filed Nov. 30, 2007, incorporated herein in its entirety.

The present invention provides methods of preparing nanoparticles incorporating ions from group 16 of the periodic table. Particularly, but not exclusively, techniques have been developed to synthesise "CIGS"-type nanoparticles incorporating for example copper, indium and/or gallium, and selenium, and optionally further including sulfur.

For widespread acceptance, photovoltaic cells (solar cells) need to produce electricity at a cost that competes with that of fossil fuels. In order to lower these costs solar cells need to have low materials and fabrications costs coupled with increased light to electric conversion efficiency.

Thin films have intrinsically low materials costs since the amount of material in the thin (~2-4 μm) active layer is small. Thus, there have been considerable efforts to develop high efficiency thin film solar cells. Of the various materials studied, chalcopyrite-based devices (Cu(In &/or Ga)(Se &, optionally S)$_2$, herein referred generically as "CIGS") have shown great promise and have received considerable interest. The band gaps of CuInS$_2$ (1.5 eV) and CuInSe$_2$ (1.1 eV) are well matched to the solar spectrum, hence photovoltaic devices based on these materials are expected to be efficient. To date, thin-film CuInS$_2$ cells with efficiencies of 12.5% and Cu(In,Ga)Se$_2$ cells with efficiencies of 18% have been recorded.

Most fabrication methods for CIGS thin films involve costly vapour phase or evaporation techniques, however it is possible to form thin films by melting or fusing nanoparticulate material into a thin film such that the nanoparticles coalesce to form large grained thin films. This can be done using metal oxide nanoparticles followed by reduction with H$_2$ and then by a reactive sintering step with a selenium containing gas, usually H$_2$Se. Alternatively and preferably this can be done using prefabricated CIGS nanoparticles. The use of CIGS nanoparticles avoids the hazardous reduction of metal oxides with H$_2$ and selenization with toxic H$_2$Se.

In order to use nanoparticulate CIGS-type nanoparticles (i.e. CIGS or similar materials) as a starting point to form the large grain thin film, the CIGS-type nanoparticles should have some key properties. Firstly, the nanoparticles should be small. When the dimensions of nanoparticles become smaller their physical, electronic and optical properties might change. The restriction of an electronic wavefunction to smaller and smaller dimensions within a particle is referred to as "quantum confinement". When nanoparticles are in this size regime they are often referred to as quantum dots. It is known that as the size of nanoparticles decreases their corresponding melting point also decreases. Also, smaller particles will pack more closely which may help the coalescence of the particles upon melting. Secondly, a narrow size distribution is very important. The melting point of the nanoparticles is related to their size, a narrow size distribution means that all of the particles will melt at approximately the same temperature giving an even, high quality (even distribution, good electrical properties) film. Finally, a volatile capping agent for the nanoparticles is generally required so that, upon relatively moderate heating, the capping agent can be removed to avoid carbon or other elements contaminating the final film upon melting of the nanoparticles.

There are a number of methods known for preparing CIGS-type nanomaterials. These include multi-component colloidal methods, single-source precursor methods and solvothermal methods. Except for the case of single-source precursor methods, known methods generally involve the reaction of Cu, In and Ga halides with a source of selenium. Typically it is elemental selenium or selenium coordinated by trioctylphosphine (TOP); however reaction with H$_2$Se has been demonstrated.

Reaction of Cu(I), In(III), Ga(III) salts in water or acetonitrile with bubbling H$_2$Se or H$_2$S with 1% polyvinyl alcohol to act as a stabilizer led to colloidal nanoparticles of the corresponding CIGS material. Sizes of the prepared nanoparticles ranged from 2-6 nm in water and 1-4 nm in acetonitrile. (Gurin, Colloids Surf. A 1998, 142, 35-40)

Reaction of CuI, InI$_3$, GaI$_3$ in pyridine with Na$_2$Se in methanol at reduced temperature under inert atmosphere yielded pyridine-capped Cu(In,Ga)Se$_x$ nanoparticles where the relative amounts of the elements in the product reflected the amounts in the precursor solutions. The product material was amorphous so the phase composition could not be ascertained, however residues of samples heated to 400° C. for TGA showed pure CIGS phase formation. Overall size distributions determined from TEM were estimated at 10-30 nm and the shape of the nanoparticles changed from spherical to tube like depending on the Cu/(In,Ga) ratios. (Shulz et al., J. Elect. Mat. 1998, 27, 433-437; Kim et al. J. Mech. Sci. Tech, 2005, 19, 2085-2090)

Reaction of InCl$_3$, CuCl and TOPSe in tri-octylphosphine oxide (TOPO) at elevated temperatures (~250° C.) resulted in TOPO-capped CuInSe$_2$ nanoparticles of approximately 5 nm in size. Increasing the temperature of reaction to 330° C. yielded particles 15-20 nm in size. (Malik et al. Adv. Mat. 1999, 11, 1441-1444; Arici et al. Thin Solid Films, 2004, 451-452, 612-618)

Reaction of CuCl, InCl$_3$ with dodecanethiol followed by addition of octadecene and TOPSe at a temperature of 180° C. resulted in dodecanethiol-capped CuInSe$_2$ nanomaterials ranging in size from 6 nm nanoparticles to 200 nm nanoplates depending reaction time. These nanoparticles displayed size-dependent quantum confinement behavior in the absorption spectra but, critically, no photoluminescence was observed. The authors noted that use of other capping agents such as TOPO, hexadecylamine, oleylamine or a combination of these ligands did not lead to formation of CuInSe$_2$ which matches the inventors own experiences. (Zhong et al. Nanotechnology, 2007, 18, 025602.)

Single-source precursor molecules have also been investigated to prepare colloidal CIGS-type nanoparticles. Thermal decomposition of the single source precursors (PPh$_3$)$_2$CuIn(SEt)$_4$ and (PPh$_3$)$_2$CuIn(SePh)$_4$ in dioctylphthalate at temperature between 200-300° C. led to the formation of nanoparticles of CuInS$_2$ and CuInSe$_2$ respectively. The nanoparticles produced ranged in size from 3-30 nm and were spherical in shape. Because of the use of non-coordinating solvents the nanoparticles formed agglomerates of insoluble material. (Castro et al. Chem. Mater. 2003, 15, 3142-3147)

Similar single source precursors (TOP)$_2$CuIn(SR)$_4$, where R=i-Pr or t-Bu, have been decomposed photolytically in dioctylphthalate to produce small (~2 nm) organic soluble CuInS$_2$ nanoparticles. (J. J. Nairn et al. Nano Letters, 2006, 6, 1218-1223).

Solvothermal methods which may be carried out at relatively low temperatures and do not require organometallic or toxic precursors have been investigated to prepare CIGS nanomaterials. Typically copper halide, indium halide, gallium halide, selenium and/or sulfur are added to a non-stick coated autoclave, which is filled with a solvent such as benzene, ethylene diamine or water, sealed and then heated for period of time. This process provided nanomaterials having an elemental composition that reflected the stoichiometries of the reactants and morphologies determined by the interaction of the solvent during the reaction. (Li et al. Adv. Mat. 1999, 11, 1456-1459; Lu et al. Inorg. Chem. 2000, 39, 1606-1607; Jiang et al. inorg. Chem. 2000, 39, 2964-2965; Xiao et al. J. Mater. Chem. 2001, 11, 1417-1420; Hu et al. Sol. State Comm. 2002, 121, 493-496; Chun et al. Thin Solid Films 2005, 480-481, 46-49; Gou et al. J. Am. Chem. Soc. 2006, 128, 7222-7229). For example, reaction of stoichiometric amounts of $CuCl_2$, $InCl_3$, Se in ethylenediamine or diethylamine in a sealed autoclave at 180° C. for 15-36 hours yielded relatively large $CuInSe_2$ nanowhiskers (width 3-6 nm, length 30-80 nm) and nanoparticles (diameter 15 nm) respectively. The elemental ratios in these materials closely matched the stoichiometries of the reactants. (Li et al. Adv. Mat. 1999, 11, 1456-1459)

Similarly, nanocrystalline $CuInS_2$ and $CuGaS_2$ have been prepared solvo-thermally by reaction of CuCl, In or Ga, and excess S in benzene or water in a sealed autoclave heated at 200° C. for 12 hours. The sizes of the $CuInS_2$ and $CuGaS_2$ nanoparticles were 5-15 nm and 35 nm respectively. (Lu et al. Inorg. Chem. 2000, 39, 1606-1607)

For the reasons mentioned above and other reasons, there is a desire to produce nanoparticles which could subsequently be used to form films by relatively cheap methods, such as but not limited to, printing or spraying. The current preparative methods described above are not currently well-suited for subsequent processing into, for example films. This is because the known methods are not able to produce nanoparticles that are small, have low melting point, narrow size distribution and incorporate a volatile capping agent because of one aspect or another. For example, reaction of CuCl, $InCl_3$ and $Na_2Se$ in methanol/pyridine yields pyridine capped nanoparticles of wide size distribution. Moreover, reaction of CuCl, $InCl_3$ and TOPSe in TOPO yields TOPO capped nanoparticles with a reasonably narrow size distribution but with a non volatile capping agent. In the case of single source precursors, the resulting nanoparticles have a reasonably narrow size distribution but a non-volatile capping agent and the required synthesis of the single source precursor increases the time process. Furthermore, the stoichiometry in the single source precursor is fixed and thus does not allow fine tuning of film stoichiometries which is necessary for film optimisation. Nanoparticles prepared via solvothermal methods are generally larger and also require a post preparative treatment to facilitate solubility.

An object of the present invention is to obviate or mitigate one or more of the problems described above which are associated with current methods for producing nanoparticles.

A first aspect of the present invention provides a process for producing nanoparticles incorporating ions selected from groups 13, 16, and 11 or 12 of the periodic table, the process comprising effecting conversion of a nanoparticle precursor composition comprising said group 13, 16, and 11 or 12 ions to the material of the nanoparticles in the presence of a selenol compound.

A new process for preparing nanoparticles, particularly CIGS-type nanoparticles is provided by the present invention which can produce small (~2 nm to 50 nm) nanoparticles with a narrow size distribution capped with volatile ligands. It is particularly preferred that the group 13, 16, and 11 or 12 ions are all included in the core of the nanoparticle and/or all included in the same layer of the nanoparticle where the nanoparticle is provided with one or more shell layers provided on the nanoparticle core. Moreover, the method can be adjusted to produce materials of different sizes and stoichiometries. The method is applicable to the production of ternary or quarternary compounds of the form $AB_{1-x}B'_xSe_{2-y}C_y$, where A is selected from the group consisting of Cu, Zn, Ag and Cd; B and B' are each independently selected from the group consisting of Al, In and Ga; C is selected from the group consisting of S and Te; $0 \leq x \leq 1$; $0 \leq y < 2$; subject to the proviso that where $x>0$, $B' \neq B$. The present invention relates to a simple method of producing CIGS-type nanoparticles of any desirable stoichiometry employing a selenol compound, for example but not limited to an alkyl or aryl selenol compound. A significant advantage provided by the use of the selenol compound is that contamination of preferred selenium-containing nanoparticles by chalocogens other than selenium, such as sulfur, is avoided. In comparative tests, not presented here, the inventors have replaced the selenol compound with a thiol compound and observed undesirable levels of sulfur contamination in $CuInSe_2$ nanoparticles. The processes of the first and second aspects of the present invention therefore provide a means of producing significantly more pure (i.e. contaminant free) selenium-containing nanoparticles than prior methods. In addition to this benefit, it is believed that the selenol compound may help to stabilise and/or form a reactive intermediate with one or more of the reacting species before the nanoparticles undergo nucleation and growth.

The use of small nanoparticles of CIGS-type material facilitates the use of much cheaper thin film fabrication methods to those currently used, which require low pressure and vacuum techniques. Moreover, the prefabricated nanoparticles of CIGS-type material can be formulated into inks and pastes which can then be deposited on to a substrate by a variety of techniques including printing (e.g. screen printing, ink jet printing, contact printing, gravure printing), or other methods, (e.g. simple doctor blade coating, spin coating, assisted aerosol spray coating, spray coating, but not restricted to such methods).

In a second aspect of the present invention there is provided a process for producing nanoparticles incorporating ions selected from groups 13, 16, and 11 or 12 of the periodic table, the process comprising effecting conversion of a nanoparticle precursor composition comprising said group 13, 16, and 11 or 12 ions to the material of the nanoparticles in the presence of a tellurol compound. Thus, a tellurol compound may be used as an alternative to using a selenol as set out above in respect of the first aspect of the present invention. Preferably the tellurol compound is an organotellurol compound incorporating an organic group as set out below in respect of preferred embodiments of the selenol compound employed in the first aspect of the present invention.

A third aspect of the present invention provides a process for fabricating a thin film comprising nanoparticles incorporating ions selected from groups 13, 16, and 11 or 12 of the periodic table, the process comprising producing nanoparticles according to the first or second aspect of the present invention and forming said thin film.

Formation of the film may comprise depositing the nanoparticles onto a supporting layer under conditions permitting formation of said thin film on said support. Deposition of the nanoparticles may be effected using any desirable method, for example but not limited to, printing, coating or spraying.

A fourth aspect of the present invention provides a process for producing a printable ink formulation comprising nanoparticles incorporating ions selected from groups 13, 16, and 11 or 12 of the periodic table, the process comprising producing nanoparticles according to the first or second aspect of the present invention and combining said nanoparticles with a suitable ink base.

A fifth aspect of the present invention relates to a photovoltaic device layer comprising a nanoparticle material produced according to the first or second aspect of the present invention.

A sixth aspect of the present invention provides a photovoltaic device incorporating a layer comprising a nanoparticle material produced according to the first or second aspect of the present invention.

There is further provided according to seventh aspect of the present invention a method of fabricating a photovoltaic device, the method comprising providing a first layer of material and providing a layer comprising a nanoparticle material produced according to the first aspect of the present invention on said first layer.

An eighth aspect provides a printable ink formulation comprising nanoparticles incorporating ions selected from groups 13, 16, and 11 or 12 of the periodic table produced according to the first aspect of the present invention and a suitable ink base.

A ninth aspect provides a printable ink formulation comprising up to around 50% w/v of nanoparticles incorporating ions selected from groups 13, 16, and 11 or 12 of the periodic table and a suitable ink base.

An tenth aspect provides a process for fabricating a thin film comprising semiconductor nanoparticles incorporating first and second ions, the process comprising depositing a layer of a formulation containing said nanoparticles on to a supporting layer and subsequently annealing said deposited nanoparticle-containing layer under a static atmosphere. Said static atmosphere is preferably a substantially inert atmosphere, which optionally contains selenium.

The first layer may comprise any material(s) that it is desirable to locate adjacent to the nanoparticle-containing layer in the photovoltaic device. Preferably said first layer comprises molybdenum. A second layer of any suitable material may be provided on said layer comprising the nanoparticle material. By way of example only, the nanoparticle containing layer may comprise an n-type material, such as, but not limited to, cadmium sulfide.

Any desirable selenol compound may be employed in the process forming the first aspect of the present invention. Preferably the selenol compound is an organoselenol compound, which is most preferably a volatile organoselenol compound. Reference to an organic compound as being 'volatile' is well understood in the relevant technical field by the skilled person and generally refers to a compound that will vaporise at temperatures and/or pressures that are relatively low compared to other species with which the volatile compound is associated. In this way, using a volatile organoselenol compound provides the advantage of allowing the selenol to be easily and cheaply removed from the nanoparticles, for example by heating.

The organoselenol compound may be represented by the formula R—SeH, where R is a substituted or unsubstituted organic group, that is one or more hydrogen atoms bonded to a carbon atom can be replaced with a non-hydrogen atom. The organic group can be saturated or include any appropriate level of unsaturation. Said organic group is preferably a linear, branched or cyclic organic group, which may be a carbocylic group or a heterocyclic group.

The organic group is preferably selected from the group consisting of alkyl, alkenyl, alkynyl and aryl. The organic group may be an alkyl, alkenyl or alkynyl group containing 2 to 20 carbon atoms, more preferably 4 to 14 carbon atoms and most preferably 6 to 10 carbon atoms. It is particularly preferred that the selenol compound is 1-octane selenol (as used in Examples 1 and 2 below). A further preferred selenol compound is 1-dodecane selenol or 1-dodecylselenol (as used in Examples 3, 4 and 5 below). Although 1-dodecane selenol is less volatile than 1-octane selenol, both compounds are sufficiently volatile to be used conveniently in the method of the present invention.

Alternatively, the organic group may be an aryl group containing 4 to 14 carbon atoms. More preferably the organic group is an aryl group containing 6 to 10 carbon atoms, still more preferably 6 to 8 carbon atoms.

The process to form nanoparticles according to the above defined aspects of the present invention preferably comprises dispersing at least a first portion of the nanoparticle precursor composition in a solvent. The first portion of the nanoparticle precursor composition may comprise a source of at least one of the group 13 ions and the group 11 or 12 ions. Preferably said first portion comprises a source of the group 13 ions and a source of the group 11 or 12 ions. The conversion of the precursor composition to the material of the nanoparticles may be conducted in any appropriate solvent. It is preferred that the solvent has a higher boiling point than the selenol compound to facilitate removal of the selenol compound by heating without substantial solvent loses. Preferably the solvent is a high boiling point (e.g. around 200° C. or higher) solvent and is most preferably a non-coordinating solvent. It is preferred that the solvent is an organic solvent, for example a saturated or unsaturated long-chain hydrocarbon solvent. Preferred solvents include long chain, e.g. $C_8$-$C_{24}$, alkanes or alkenes, such as octadecene, ($C_{18}H_{36}$) which has a boiling point in excess of 250° C.

In a preferred embodiment of the inventive method the solvent is heated to a first temperature after addition of the first portion of the nanoparticle precursor composition. The first temperature may be around 70 to 170° C., more preferably around 90 to 150° C. and still more preferably around 100 to 140° C. Most preferably the first temperature is around 140° C. Said heating may be applied for any appropriate length of time, preferably around 10 to 40 minutes, more preferably around 20 to 30 minutes.

Preferably the selenol compound is added to the solvent containing the first portion of the nanoparticle precursor composition. Following addition of the selenol compound, the solvent may be heated to a temperature of around 100 to 200° C., more preferably around 120 to 160° C. and most preferably around 160° C. Said heating can be applied for any desirable time period, by way of example, heating may be applied for up to around 30 minutes.

Following heating of the reaction mixture containing the first portion of the nanoparticle precursor composition and the selenol compound dispersed in the solvent, it is preferred that a second portion of the nanoparticle precursor composition is added to the reaction mixture.

The second portion of the nanoparticle precursor composition preferably comprises a source of the group 16 ions. It is preferred that the second portion of the nanoparticle precursor composition is added relatively slowly, for example dropwise, to ensure nanoparticle growth proceeds in a well-controlled manner.

It is preferred that the solvent containing the nanoparticles precursor composition and the selenol compound is heated to a second temperature during and/or after addition of the second portion of the nanoparticle precursor composition. Preferably the second temperature is higher than the first temperature. By way of example, the second temperature is preferably around 120 to 220° C., more preferably around 140 to 200°

C., still more preferably around 150° C. to 170° C. It is particularly preferred that the second temperature is around 160° C. Said heating to the second temperature may be applied for any appropriate time. It has been found that heating to the second temperature over a period of up to around 10 hours may be suitable. Once the solvent has been heated to the second temperature it is preferred that the solvent be maintained at approximately that temperature for a period of time required to provide nanoparticles possessing the desired properties. Suitable time periods in this regard may be up to around 10 hours, more preferably around 1 to 8 hours, and most preferably around 4 to 7 hours.

Preferably the group 13 ions are provided in the nanoparticle precursor composition by a first group 13 ion-coordination compound, such as an acetate compound, for example indium acetate as used in Examples 1 and 2 below, or gallium acetate. The nanoparticles may incorporate at least one further type of group 13 ion, in which case said at least one further type of group 13 ions may be provided in the nanoparticle precursor composition by a second group 13 ion-coordination compound. A suitable second group 13 ion-coordination compound is an acetate compound.

The nanoparticle precursor composition may comprise a group 11 ion-coordination compound, which may, for example be an acetate compound, such as copper acetate as used below in the Examples.

The nanoparticle precursor composition may comprise a group 12 ion-coordination compound, such as an acetate compound, e.g. zinc acetate.

In the nanoparticles produced according to the above-defined aspects of the present invention the group 16 ions are preferably selenium ions. At least a portion of the selenium ions may be provided by the selenol compound. Alternatively, or additionally at least a portion of the selenium ions may be provided by a selenium compound, such as but not limited to trioctylphosphine selenides, provided in the nanoparticle precursor compound.

The nanoparticles produced according to the above-defined aspects of the present invention may additionally comprise sulfur and/or tellurium ions, which may be provided by any convenient source of these ions, such as trioctylphosphine sulfide and/or trioctylphosphine telluride respectively.

The group 13 ions provided in the nanoparticles of the above-defined aspects of the present invention may be selected from the group consisting of aluminium, gallium and indium. The nanoparticles may additionally comprise at least one different type of group 13 ion selected from the group consisting of aluminium, gallium and indium.

In a preferred embodiment of the above-defined aspects of the present invention the nanoparticles formed using the process incorporate gallium and indium ions.

The nanoparticles may incorporate group 11 ions selected from the group consisting of copper and silver. The nanoparticles may incorporate group 12 ions selected from the group consisting of zinc or cadmium.

In a further preferred embodiment of the above-defined aspects of the present invention the nanoparticles incorporate copper, indium, gallium and selenium ions, and may further incorporate sulfur ions.

The nanoparticles produced using the process of the present invention can be represented by formula (I)

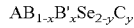　　　　　　Formula (I)

where
A is selected from the group consisting of Cu, Zn, Ag and Cd;
B and B' are each independently selected from the group consisting of Al, In and Ga;
C is selected from the group consisting of S and Te;
$0 \leq x \leq 1$;
$0 \leq y < 2$;
subject to the proviso that where $x > 0$, $B' \neq B$.

In Formula (I) A is preferably copper. Moreover, it is preferred that $0 < x \leq 1$, B is gallium and B' is indium. Furthermore, preferably $0 < y < 2$ and C is sulfur.

Nanoparticles produced using the process of the present invention may be selected from the group consisting of $CuInSe_2$; $CuIn_xGa_{1-x}Se_2$; $CuGa_2Se_2$; $ZnInSe_2$; $ZnIn_xGa_{1-x}Se_2$; $ZnGa_2Se_2$; $AgInSe_2$; $AgIn_xGa_{1-x}Se_2$; $AgGa_2Se_2$; $CuInSe_{2-y}S_y$; $CuIn_xGa_{1-x}Se_{2-y}S_y$; $CuGa_2Se_{2-y}S_y$; $ZnInSe_{2-y}S_y$; $ZnIn_xGa_{1-x}Se_{2-y}S_y$; $ZnGa_2Se_{2-y}S_y$; $AgInSe_{2-y}S_y$; $AgIn_xGa_{1-x}Se_{2-y}S_y$; and $AgGa_2Se_{2-y}S_y$, where $0 \leq x \leq 1$ and $0 \leq y < 2$.

Selenium may be replaced with tellurium in any of the above listed materials. This may be achieved by using a tellurol in place of a selenol in the procedure employed to produce the nanoparticles.

The process of the above-defined aspects of the present invention may be used to produce any desirable form (e.g. size, shape, number of phases etc) of nanoparticle incorporating ions from groups 13, 16, and 11 or 12 of the periodic table. The process of the above-defined aspects of the invention is particularly suitable for producing nanoparticles comprising ternary or quarternary compounds. Moreover, it will be appreciated that the nanoparticles produced according to the above-defined aspects of the present invention can be subjected to any desirable number of further processing steps. By way of example, any desirable number of outer shells of semiconducting or non-semiconducting material can be grown on the surface of the nanoparticles. Furthermore, once the nanoparticles have been formed, the surface atoms of the nanoparticles will typically be coordinated to a capping agent, which in the first instance will most likely comprise the selenol compound employed in the inventive process. In the preferred embodiments described above in which a volatile selenol compound is employed, the selenol capping agent can then be easily driven off with heating to yield 'naked' nanoparticles to which any further coordinating ligand, e.g. a Lewis base, can be added to bestow the resulting nanoparticles with any desirable property. By way of example, a further capping agent could be added which would modify the solubility of the nanoparticles and/or the ability of the nanoparticles to bind to other species.

The fourth aspect of the present invention provides a process for producing a printable ink formulation by producing nanoparticles according to the first or second aspect of the present invention and combining said nanoparticles with a suitable ink base.

The ink base preferably comprises one or more organic compounds, which may be selected from the group consisting of an aromatic compound, an aliphatic compound and a selenol compound. In a preferred embodiment, said ink base comprises toluene and dodecane selenol.

It is preferred that a sufficient quantity of said nanoparticles are combined with said ink base such that the resulting ink formulation comprises up to around 50% w/v of said nanoparticles, more preferably around 10 to 40% w/v of said nanoparticles, and most preferably around 20 to 30% w/v of said nanoparticles.

Combining said nanoparticles and said ink base may produce a solution which is then treated to remove any unwanted gaseous byproducts.

In the eighth aspect of the present invention which provides a printable ink formulation comprising nanoparticles incorporating ions selected from groups 13, 16, and 11 or 12 of the periodic table produced according to the first aspect of the present invention and a suitable ink base, it is preferred that the formulation comprises up to around 50% w/v of said nanoparticles.

As set out above, the ninth aspect provides a printable ink formulation comprising up to around 50% w/v of nanoparticles incorporating ions selected from groups 13, 16, and 11 or 12 of the periodic table and a suitable ink base.

With regard to the eighth and/or ninth aspects it is preferred that the ink base comprises one or more organic compounds, which may be selected from the group consisting of an aromatic compound, an aliphatic compound and a selenol compound. In a preferred embodiment said ink base comprises toluene and dodecane selenol.

The ink formulation may comprise around 10 to 40% w/v of said nanoparticles or, more preferably, around 20 to 30% w/v of said nanoparticles.

As set out above, the third aspect of the present invention provides a process for fabricating a thin film comprising nanoparticles incorporating ions selected from groups 13, 16, and 11 or 12 of the periodic table, the process comprising producing nanoparticles according to the first or second aspect of the present invention and forming said thin film. It is preferred that formation of said film comprises depositing a formulation containing said nanoparticles by printing, coating or spraying onto a supporting layer under conditions permitting formation of said thin film on said supporting layer.

Deposition of the nanoparticle formulation may be achieved using any appropriate method but it preferably comprises drop casting and/or spin coating.

Where spin coating is applied, said spin coating may be effected using a spinning speed of up to around 5000 rpm, more preferably a spinning speed of around 500 to 3500 rpm, and most preferably a spinning speed of around 2000 rpm. Alternatively or additionally, said spin coating may be effected over a time period of up to around 300 seconds, more preferably a time period of around 20 to 150 seconds, and most preferably a time period of around 60 seconds.

Formation of said film preferably comprises at least one annealing cycle, the or each annealing cycle comprising a series of steps in which the temperature of the nanoparticle formulation deposited on the supporting layer is repeatedly increased and subsequently maintained at said increased temperature for a predetermined period of time, following which the nanoparticle formulation is cooled to form the film.

It is preferred that the highest temperature to which the nanoparticle formulation is heated during said at least one annealing process is below the vapourisation temperature of selenium at the pressure at which heating is being effected and/or less than or equal to around 450° C., more preferably less than or equal to around 410° C. This is to ensure that loses of selenide ions from the nanoparticle-containing formulation/film are at least minimized or, more preferably substantially avoided.

Preferably each of said series of steps is effected to provide an increase in temperature of the nanoparticle formulation of around 10 to 70° C. Initial steps may be effected to provide larger temperature increases than later steps. By way of example, a first of such steps may effect a temperature increase of around 50 to 70° C., followed by one or more subsequent steps in which the temperature is increased by around 10 to 20° C.

Each of said series of steps preferably comprises increasing the temperature of the nanoparticle formulation at a rate of up to around 10° C./minute, more preferably at a rate of around 0.5 to 5° C./minute and most preferably at a rate of around 1 to 2° C./minute. In a preferred example, initial steps may involve temperature increases at a greater rate than later steps. For example, in a preferred embodiment, one or two of the initial steps may comprise heating to provide temperature increases of around 8 to 10° C./minute, while later steps may involve temperature increases of around 1 to 2° C./minute.

As mentioned above, each step involves heating and then maintaining the nanoparticle-containing formulation at said increased temperature for a predetermined period of time. Said predetermined time period may be up to around 60 minutes, more preferably said predetermined time period is around 5 to 40 minutes, and most preferably is around 10 to 20 minutes.

In a preferred embodiment the or at least one of the annealing cycles is effected under a static atmosphere, a substantially inert atmosphere and/or an atmosphere containing selenium.

In a particularly preferred process formation of said nanoparticle-containing film comprises first and second annealing cycles, the first annealing cycle increasing the temperature of the nanoparticle formulation to a first maximum temperature and the second annealing cycle increasing the temperature of the nanoparticle formulation to a second maximum temperature, said second maximum temperature being higher than said first maximum temperature.

It is preferred that the second maximum temperature is less than or equal to around 450° C. and/or that the first maximum temperature is less than or equal to around 300° C. The second annealing cycle is preferably carried out in a static atmosphere.

It is preferred that said nanoparticle formulation comprises said nanoparticles and a suitable ink base. Said formulation is preferably in accordance with the eighth aspect of the present invention.

Preferred non-limiting embodiments of the present invention will now be described, by way of example only, in which.

Figure 8:
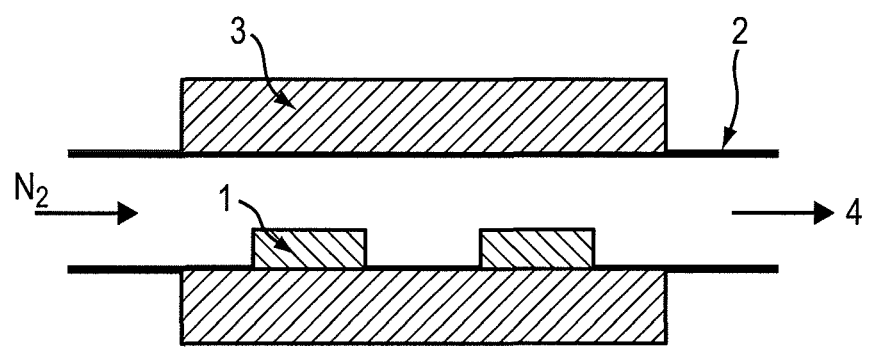
Figure 9:
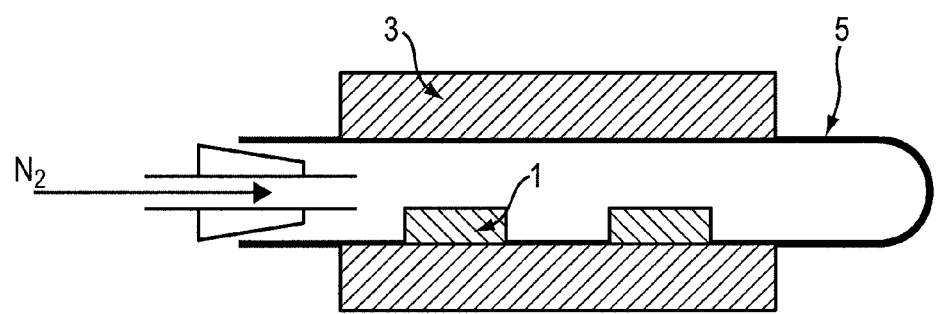
Figure 10:
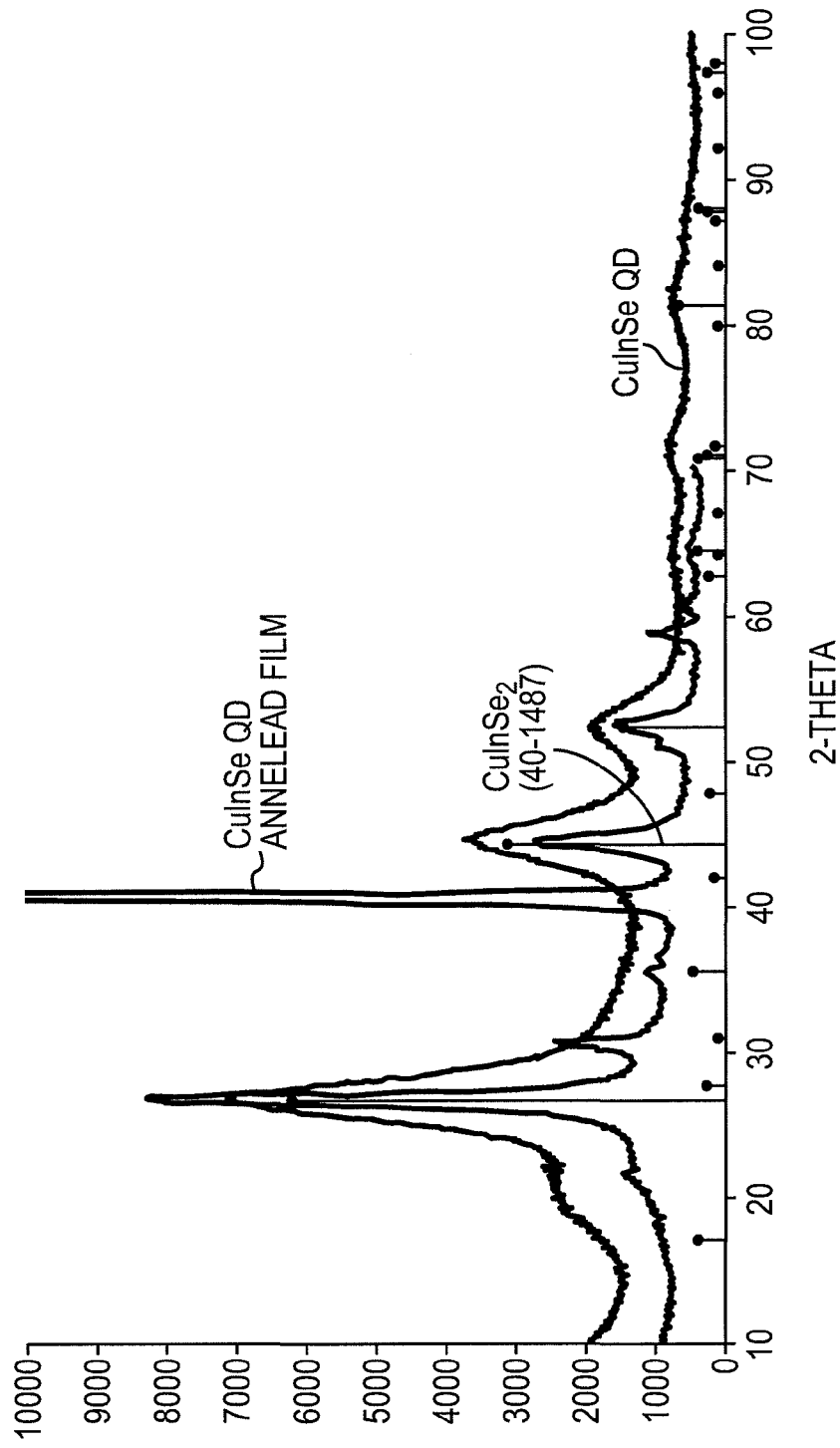

FIG. 8; is a schematic cross-sectional diagram of apparatus used to produce films according to the present invention comprising Cu/In/Se NPs FIG. 9 is a schematic cross-sectional diagram of apparatus used to produce films according to the present invention comprising Cu/In/Se NPs, the apparatus now including a vacuum tube to contain the Cu/In/Se film during high temperature annealing; and FIG. 10 is an overlay of the powder XRD diffraction patterns of a thin film of Cu/In/Se quantum dots and of an annealed thin film of Cu/In/Se quantum dots prepared as described below in Example 5.

EXAMPLES

Example 1

Cu(I) acetate (1 mmol) and In(III) acetate (1 mmol) are added to a clean and dry RB-flask. Octadecene ODE (5 mL) is added the reaction mixture heated at 100° C. under vacuum for 30 mins. The flask is back-filled with nitrogen and the temperature raised to 140° C. 1-octane selenol is injected and the temperature falls to 120° C. The resulting orange suspension is heated with stirring and a transparent orange/red solution is obtained when the temperature has reached 140° C. This temperature is maintained for 30 minutes then 1M tri-octyl-phoshine selenide TOPSe (2 mL, 2 mmol) is added dropwise and the solution heated at 160° C. The PL is monitored until it reaches the desired wavelength after which it is cooled and the resulting oil washed with methanol/acetone (2:1) 4-5 times and finally isolated by precipitation with acetone.

Example 2

Large-Scale Production

A stock solution of TOPSe was prepared by dissolving Se powder (10.9, 138 mmol) in TOP (60 mL) under nitrogen. To dry, degassed ODE was added Cu(I) acetate (7.89 g, 64.4 mmol) and In(III) acetate (20.0 g, 68.5 mmol). The reaction vessel was evacuated and heated at 140° C. for 10 min, back-filled with $N_2$ and cooled to room temp. 1-Octane selenol (200 mL) was added to produce a bright orange suspension. The temperature of the flask was raised to 140° C. and acetic acid distilled from the reaction at 120° C. On reaching 140° C. the TOPSe solution was added dropwise over the course of 1 hour. After 3 hours the temperature was raised to 160° C. The progress of the reaction was monitored by taking aliquots from the reaction periodically and measuring the UV/Visible and photoluminescence spectra. After 7 hours the reaction was cooled to room temperature and the resulting black oil washed with methanol. Methanol washing was continued until it was possible to precipitate a fine black material from the oil by addition of acetone. The black precipitate was isolated by centrifugation, washed with acetone and dried under vacuum. Yield: 31.97 g.

Figure 1:
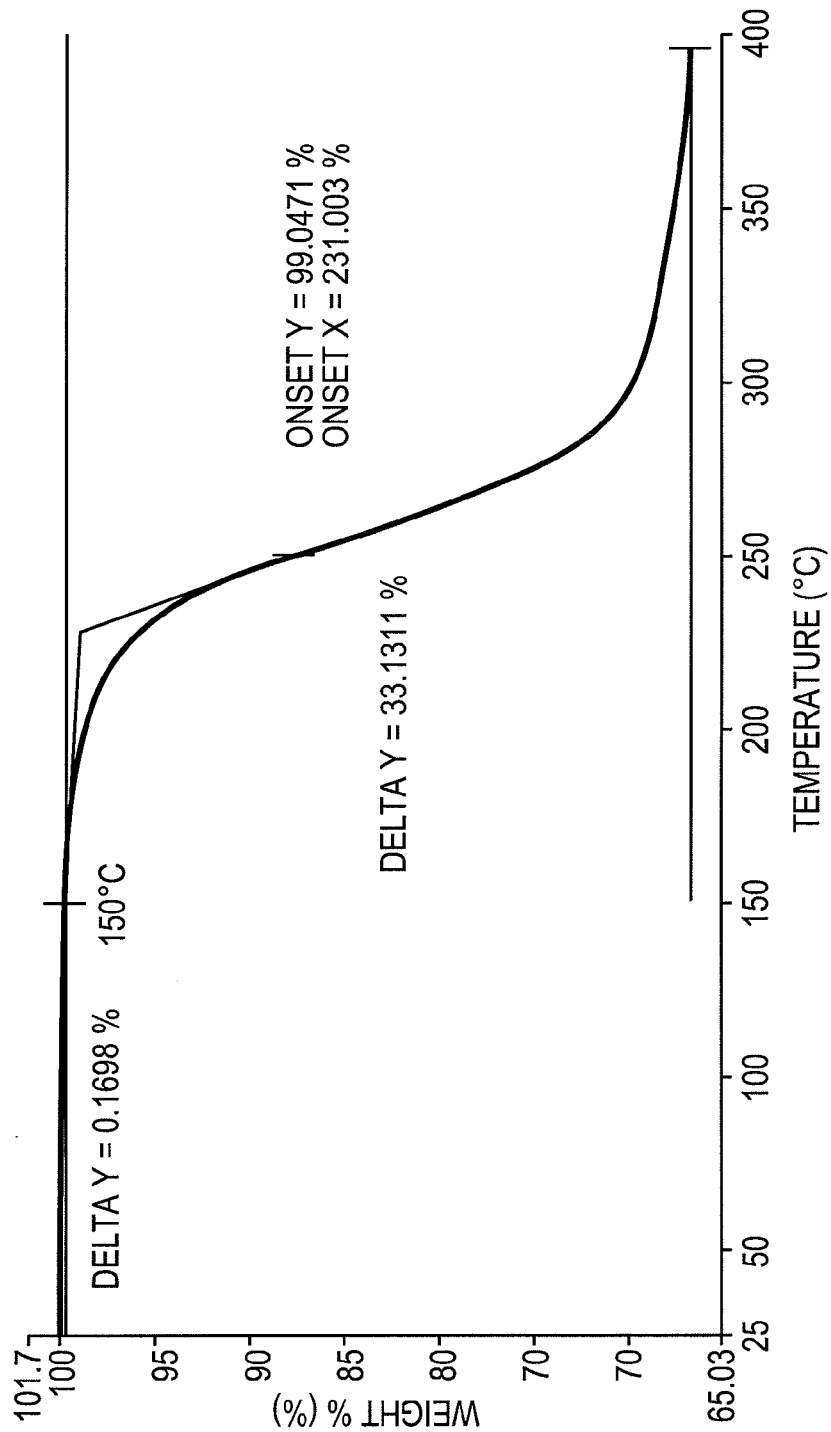
FIG. 1 is a TGA trace of 1-octane selenol capped Cu/In/Se nanoparticles (NP) heating rate 10° C./min under nitrogen atmosphere.

TGA analysis (FIG. 1) shows that CIGS nanoparticles produced by the current method loses 0.17% w/w between RT and 150° C. probably due to residual solvent. It loses a further 33.13% w/w between 150° C. and 400° C. which is due to the loss of the 1-octane selenol capping agent. Moreover, the capping agent is completely removed and does not effect the final film composition. However, the capping agent may be exchange for a different ligand.

The outer most layer (capping agent) of organic material helps to inhibit particles aggregation when in the form of an ink or paste and also further protects the nanoparticle from their surrounding chemical environment. Upon work-up of the inventive method the capping agent is the solvent that the nanoparticle preparation was undertaken in namely the selenol which is a Lewis base compound. However, the outer ligands can be replaced by other Lewis base compound diluted in a inert solvent such as a hydrocarbon whereby there is a lone pair of electrons that are capable of donor type coordination to the surface of the nanoparticle and include but are not restricted to mono- or multi-dentate ligands such as phosphines (trioctylphosphine, triphenolphosphine, t-butylphosphine), phosphine oxides (trioctylphosphine oxide), alkyl phosphonic acids, alkyl-amine (hexadecylamine, octylamine), aryl-amines, pyridines, a long chain fatty acid and thiophenes, but is not restricted to these materials.

Inductively coupled plasma atomic emission spectroscopy (ICPAES) analysis (Cu, In, Se) of the TGA residue, i.e. Cu/In/Se cores only after the 1-octane selenol capping agent has been removed, provided the following Cu 16.6%; In 36.6%; Se 48.3%, corresponding to Cu1.00, In1.22, Se2.34, and a Cu/In ratio of 0.82.

Figure 2:
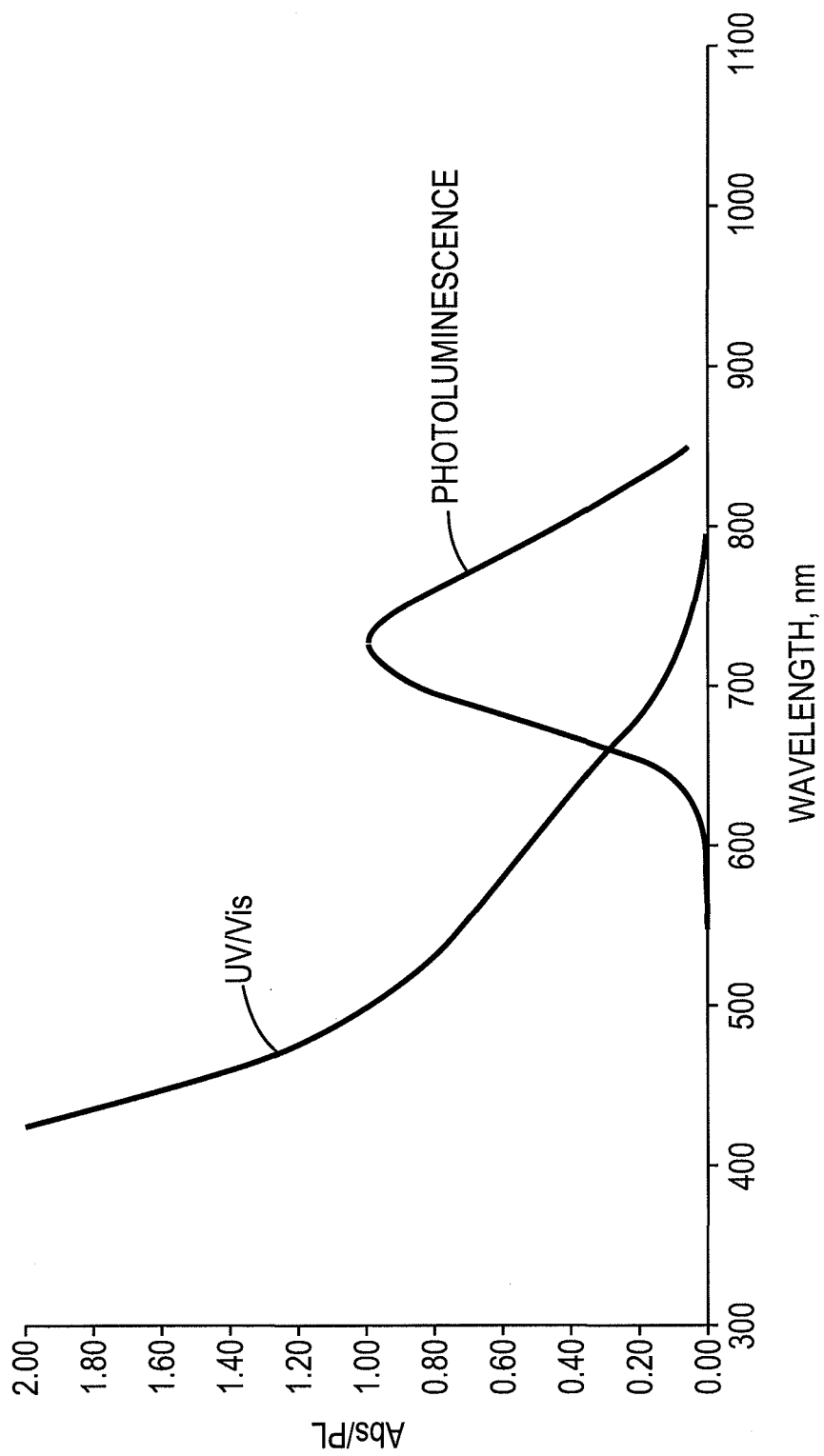
FIG. 2 is a combined UV/Visible and Photoluminescence spectrum of Cu/In/Se NPs showing a quantum confinement effect obtained using the methodology of Example 2 below. $PL_{max}$=727 nm, FWHM=117 nm.

FIG. 2 shows the absorption and photoluminescence spectrum of CISe NPs in toluene solution. The absorption spectrum shows a broad shoulder with a tail to longer wavelengths. The absorption band edge (ca. 730 nm) is blue shifted compared to that of the bulk $CuInSe_2$ (ca 1200 nm). The shape of the absorption and PL spectra suggest a narrow size distribution of particles. The blue shift is due to the quantum confinement effect, because the average size of the particles is less than the Bohr radii of $CuInSe_2$ (10.6 nm). Weak PL is observed the wavelength of which red-shifts as the NPs grow.

Figure 3:
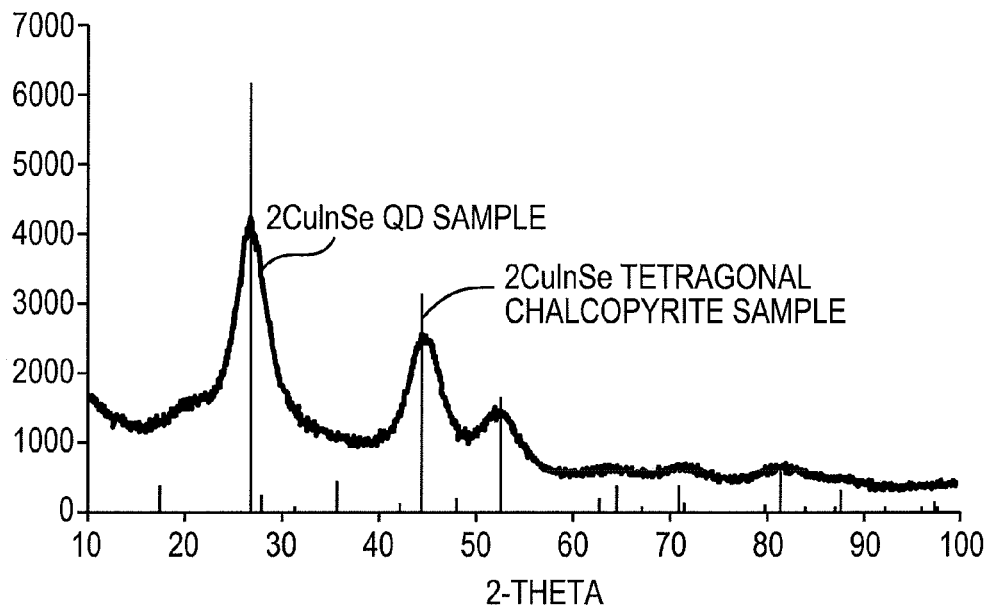
FIG. 3 is a powder XRD pattern of a Cu/In/Se NPs sample obtained using the methodology of Example 2 below (line) compared to tetragonal chalcopyrite (JCDPS 40-1487) $CuInSe_2$, (bars)
Figure 4:
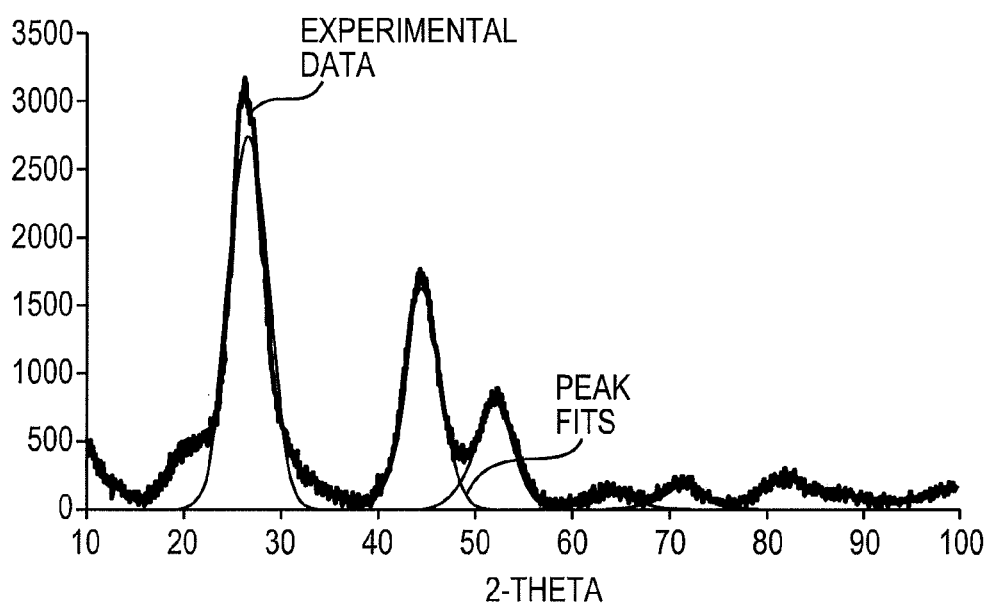
FIG. 4 is a powder XRD pattern of a Cu/In/Se NPs sample obtained using the methodology of Example 2 below with background subtracted and peaks fit with Gaussian functions.
Figure 5:
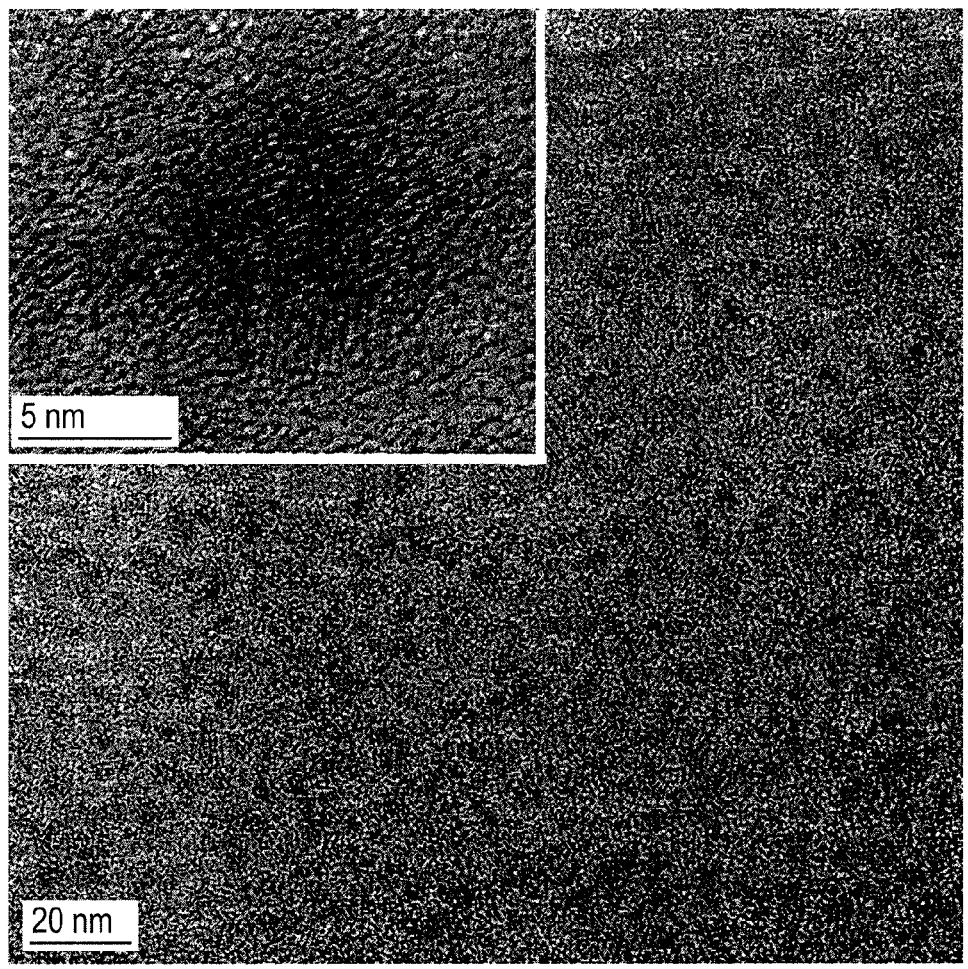
FIG. 5 is a TEM image of Cu/In/Se NPs (large image) and a single NPs (inset), scale bars are 20 nm and 5 nm respectively.

The powder XRD patterns of the CISe QDs are shown in FIG. 3 and show the crystalline nature of the QDs. Chalcopyrite $CuInSe_2$ has two phases, tetragonal and cubic. Each peak in the diffraction pattern can be indexed to the appropriate reference pattern, in this case tetragonal chalcopyrite structure (JCDPS 40-1487). After baseline subtraction the pattern can be fit with Gaussian functions the peak position and FWHM of which can be entered into the Scherrer equation (d=0.9/A cos; =x-ray wavelength, A=FWHM) to estimate a particle size of 2 nm. The Scherrer formula is known to be uncertain for X-ray patterns with overlapping peaks. TEM images (FIG. 5) show nearly monodisperse spherical nanoparticles with an average diameter of 5 nm.

It is possible by varying the initial ratios of Cu:In acetates to control the Cu/In ratios in the final QDs. The final elemental ratio in the QD appears to be related to the PL emission wavelength which in turn is related to the size of the QD.

Nanoparticle film growth may be initiated by any method of heating, for example using an external heating source. Heating may be applied by thermolysis or using solvothermal conditions. The term "solvothermal", as used herein, refers to heating in a reaction solution so as to initiate and sustain particle growth. Further terms sometimes used to describe this process include "thermolsolvol", "solution-pyrolysis", or "lyothermal".

Figure 6:
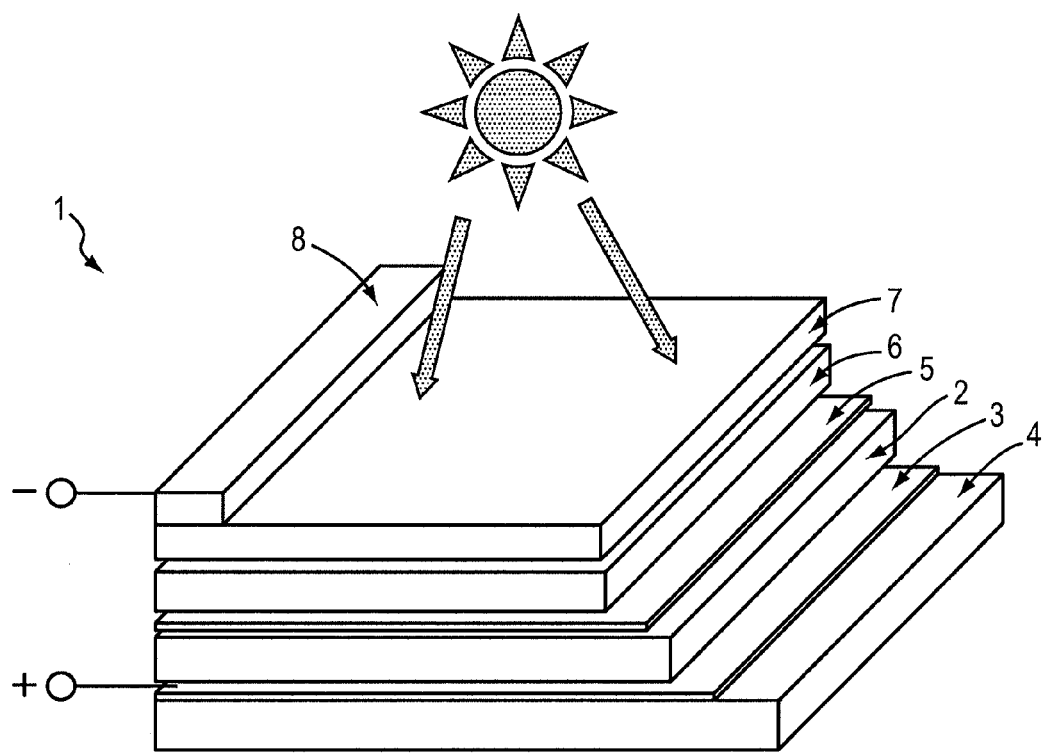
FIG. 6 is a schematic illustration of an exemplary photovoltaic device incorporating a CIGS-type material produced according to the present invention.

A further aspect of the present invention relates to photovoltaic devices, such as solar cells, fabricated to include a layer of a CIGS-type material produced according to the present invention. An exemplary, but non-limiting, embodiment of such a device is illustrated in FIG. 6. The device represented in this Figure is a solar cell 1 comprising a layer of p-type $CuInGaSe_2$ 2 deposited on a conventional Mo layer 3 supported on a glass base layer 4. On top of the CIGS layer 2 is provided a thin layer of n-type CdS 5 upon which has been deposited layers of ZnO 6 and ZnO:Al 7, with Ni/Al contacts 8 provided thereon.

Example 3

CISe Nanoparticle Preparation Using 1-Dodecane Selenol

Cu(I) acetate (3.220 mmol) and In(III) acetate (3.424 mmol) were added to a clean and dry round-bottomed flask.

Figure 7:
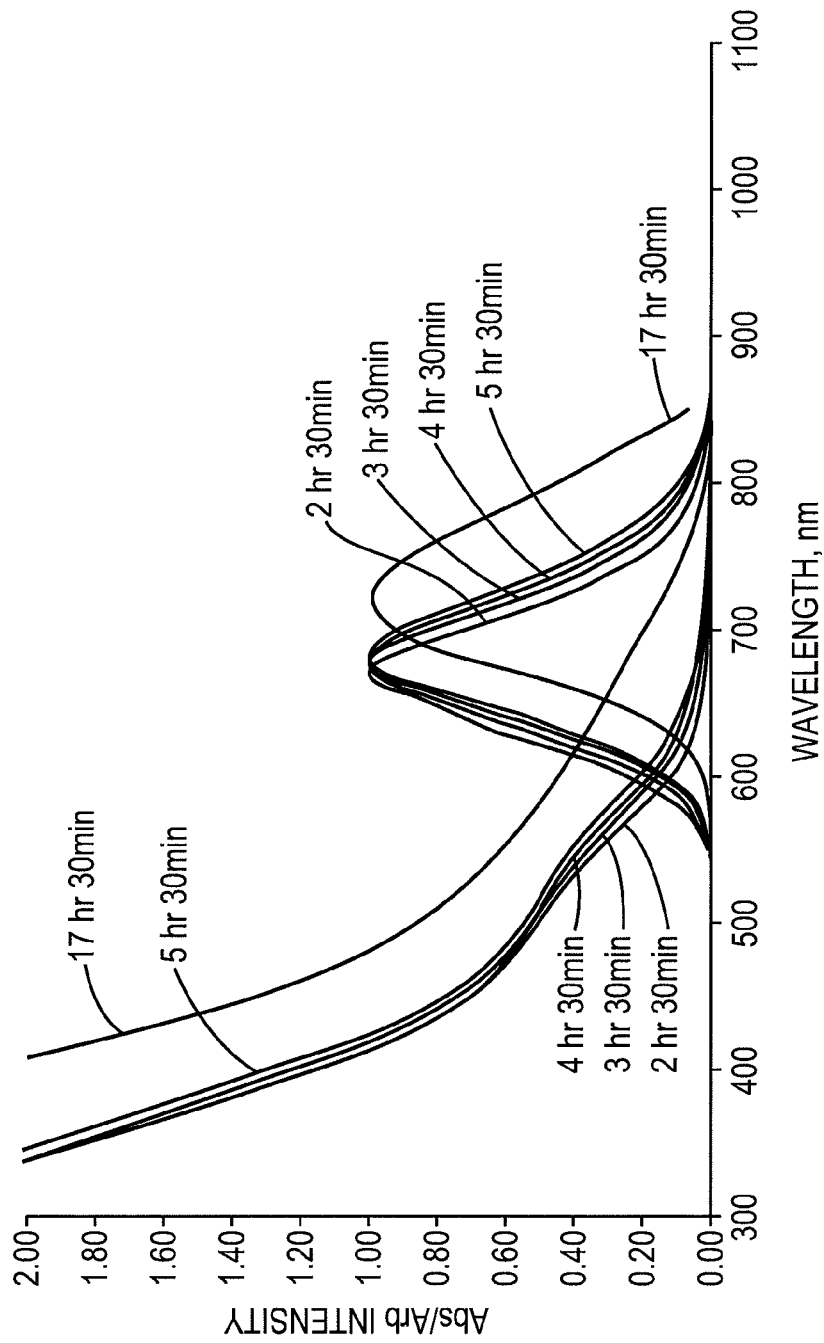
FIG. 7 is a combined UV/Visible and Photoluminescence spectrum of Cu/In/Se NPs determined during the procedure described below in Example 3.

Octadecene (ODE) (15 mL) was added to the reaction mixture, which was then heated at 140° C. under vacuum for 30 minutes. The flask was back-filled with nitrogen and the temperature raised to 160° C. 1-dodecane selenol (10 mL) was injected and the temperature fell to 140° C. The resulting orange solution was heated with stirring and the temperature maintained for 15 minutes. Then 1M TOPSe (6.84 mL, 6.84 mmol) was added dropwise over 25 minutes while the solution temperature was maintained at 160° C. The photoluminescence was monitored until it reached the desired wavelength (see FIG. 7) after which it was cooled and the resulting oil washed with methanol/acetone (2:1) 4-5 times and finally isolated by precipitation with acetone. Yield 1.086 g, Elemental analysis Cu 9.69%, In 22.36%.

Example 4

Preparation of CuInSe Quantum Dot Ink

A 1 ml solution of CuInSe material was prepared by adding 250 mg of solid CuInSe material (CIS QD) to around 900 μl toluene and around 100 μl of dodecane selenol to provide a 25% w/v CuInSe solution. The composition of the CIS QD material was Cu(1.00) In(1.36) Se(2.46) providing a Cu/In ratio of 0.74. The mixture was sonicated to help dissolve the CIS QDs after which the entire solution was filtered. The filtered solution was centrifuged at 12000 rpm for 5 minutes to remove any residual gas brought about by oxidation of the selenol.

Example 5

Fabrication Quantum Dot (QD) Thin Film Fabrication

Mo-Glass Substrate Preparation

Mo-glass substrates were cut from sheets into approximately 1 cm×2 cm pieces. The Mo-glass substrate pieces were cleaned in detergent and rinsed in distilled water. Following this the Mo-glass substrates were also cleaned with acetone.

Spin Coating

Mo-glass substrates were spin coated using a pipette to administer the CIS QD ink solution prepared as in Example 4. The solution was drop cast onto the substrate whilst the substrate was stationary. Coated Mo-glass substrates were then spun at 2000 rpm for 60 seconds. If thicker films are desired then lower spinning speeds can be employed. If thinner films are required then higher spinning speeds may be used.

First Stage Anneal

With reference to FIG. 8, the CIS/Mo-glass films (1) prepared as described above were placed inside a quartz annealing tube (2) and the tube placed inside a tube furnace (3). A nitrogen (N$_2$) source was connected to one end of the tube (2) and the other end of the tube (2) was connected to a bleach reservoir (4). Within the furnace (3) the temperature profile set out below in Table 1 was followed up to 280° C. After annealing, the films were allowed to cool with the cooling of the furnace, i.e. the films were kept inside the tube furnace. This is to avoid a cooling rate that is too fast may cause the films to deteriorate or accelerate any cracking that has begun.

TABLE 1

| Temperature (° C.) | Ramp rate (° C./min or hold time) | Film colour | Tube condensate colour |
|---|---|---|---|
| 20/30 → 90 | 5° C./min | Yellow, Blue, Red etc | None |
| 90 → 140 | 2° C./min | — | White |
| 140 | 20 mins | — | — |
| 140 → 170 | 1° C./min | — | — |
| 170 | 30 mins | — | — |
| 170 → 180 | 1° C./min | — | — |
| 180 | 30 mins | — | — |
| 180 → 220 | 1° C./min | — | — |
| 220 | 30 mins | Red/Orange | — |
| 220 → 260 | 1° C./min | Orange/Yellow | Yellow |
| 260 | 30 mins | Yellow | — |
| 260 → 270 | 1° C./min | — | — |
| 270 | 30 mins | — | — |
| 270 → 280 | 1° C./min | — | — |
| 280 | 30 mins | — | — |

Recoat and Anneal

The above procedures for spin coating and annealing were repeated twice more to produce an appreciably thick film (circa 800 nm). By this time the film had changed to a dark brown/black colour, with a shiny/mirror-like finish.

Second Stage Anneal Above 280° C.

In order to limit Se loss from the films, for annealing above 280° C., the CIS/Mo films were heated in a static N$_2$ atmosphere. Referring to FIG. 9, a vacuum tube (5) was evacuated and then filled with N$_2$. The sealed vacuum tube (5) was then connected to a nitrogen feed so that any expansion/pressure can be released whilst still maintaining an inert atmosphere. Within the furnace (3) the temperature profile set out below in Table 2 was followed, after which, the final annealed films were allowed to cool with the cooling of the furnace.

TABLE 2

| Temperature (° C.) | Ramp rate (° C./min or hold time) | Film colour | Tube condensate |
|---|---|---|---|
| 20/30 → 150 | 10° C./min | Dark brown, Black | None |
| 150 → 220 | 2° C./min | — | White |
| 220 → 260 | 1° C./min | — | — |
| 260 | 20 mins | — | — |
| 260 → 270 | 1° C./min | — | — |
| 270 | 20 mins | — | — |
| 270 → 280 | 1° C./min | — | — |
| 280 | 10 mins | — | — |
| 280 → 410 | 1° C./min | — | — |

Film Characterisation

The film prepared as described above had a thickness of 800 nm with a surface roughness of 1-2 nm RMS. Surface resistivity measured using standard methods was in the range 10 kOhms-50 kOhms which is consistent with the optimum film resistivity of CIGS films which is in the range of up to around 200 kOhms, more preferably 20 kOhms-200 kOhms.

FIG. 10 is an overlay of the powder XRD diffraction patterns of a thin film of CuInSe$_2$ quantum dots and of an annealed thin film of CuInSe$_2$ quantum dots. The large peak at 40 degrees is due to the molybdenum in the molybdenum-coated glass substrate upon which the annealed thin film was deposited.

The XRD data confirm that the films prepared were CuInSe$_2$ films, in particular, that the selenium content was maintained after film formation. Both XRD patterns confirm that the CuInSe$_2$ quantum dots had the tetragonal chalcopyrite structure. Importantly, the tetragonal chalcopyrite phase remained after the annealing process.

All of the peaks for the annealed thin film show decreased FWHM indicating larger domain sizes from which it is understood that the annealing process had resulted in quantum dot coalescence and growth. After baseline subtraction the diffraction pattern can be fit with a number of Gaussian curves. The FWHM of these curves can be used with the Scherrer equation to estimate particles sizes of around 2 nm for the as deposited thin film and 6 nm for the annealed thin film.

It will be evident to the skilled person how the annealed thin film thus formed may be employed in a photovoltaic device. Methods known to the skilled person can be utilized to fabricate such a device to incorporate a nanoparticle thin film as described above in Example 5.

The invention claimed is:

1. A printable ink formulation, comprising:
   an ink base, and
   a population of semiconductor nanoparticles, comprising semiconductor nanoparticles represented by the formula:

$AB_{1-x}B'_xSe_{2-y}C_y$ where
   A is Cu;
   B is In;
   B' is Ga;
   C is selected from the group consisting of S and Te;
   x is greater than or equal to 0 and less than or equal to 1;
   y is greater than or equal to 0 and less than 2; and
   wherein the semiconductor nanoparticles further comprise surface-attached ligands that comprise octane selenol or dodecane selenol.

2. A printable ink formulation according to claim 1, wherein the surface-attached ligands are attached to the surface of the nanoparticles via a carbon-selenium bond.

3. A printable ink formulation according to claim 1, wherein the ink base comprises one or more organic compounds.

4. A printable ink formulation according to claim 1, wherein the ink base comprises a dissolved selenol compound.

5. A printable ink formulation according to claim 1, wherein the ink base comprises toluene.

6. A printable ink formulation according to claim 1, comprising up to 50% w/v of semiconductor nanoparticles.

7. A printable ink formulation according to claim 1, comprising around 20 to around 40% w/v of semiconductor nanoparticles.

8. A printable ink formulation, comprising:
   an ink base comprising a dissolved selenol compound, and
   a population of semiconductor nanoparticles, comprising semiconductor nanoparticles represented by the formula:

$AB_{1-x}B'_xSe_{2-y}C_y$ where
   A is Cu;
   B is In;
   B' is Ga;
   C is selected from the group consisting of S and Te;
   x is greater than or equal to 0 and less than or equal to 1;
   y is greater than or equal to 0 and less than 2; and
   wherein the semiconductor nanoparticles further comprise surface-attached ligands comprising a carbon-selenium bond.

* * * * *